United States Patent
Lai et al.

(10) Patent No.: US 7,285,800 B2
(45) Date of Patent: Oct. 23, 2007

(54) LIGHT-EMITTING GALLIUM NITRIDE-BASED III-V GROUP COMPOUND SEMICONDUCTOR DEVICE WITH HIGH LIGHT EXTRACTION EFFICIENCY

(75) Inventors: Mu-Jen Lai, Chungli (TW); Shi-Ming Yang, Wuchi Township, Taichung County (TW); Chi-Feng Chan, Pingjhen (TW); Schang Jing Hon, Pa Te (TW); Jenn-Bin Huang, Pingjhen (TW); Hsueh-Feng Sun, Taoyuan (TW)

(73) Assignee: Supernova Optoelectronics Corporation, Taoyuan County (TW)

( * ) Notice: Subject to any disclaimer, the term of this patent is extended or adjusted under 35 U.S.C. 154(b) by 0 days.

(21) Appl. No.: 10/986,147

(22) Filed: Nov. 12, 2004

(65) Prior Publication Data
US 2006/0054898 A1    Mar. 16, 2006

(30) Foreign Application Priority Data
Sep. 16, 2004    (TW) ................ 93214830 U

(51) Int. Cl.
*H01L 27/15*    (2006.01)

(52) U.S. Cl. .................... 257/81; 257/98; 257/99; 257/79

(58) Field of Classification Search .......... 257/79, 257/98–99, 81
See application file for complete search history.

(56) References Cited

U.S. PATENT DOCUMENTS

| | | | |
|---|---|---|---|
| 6,420,732 B1* | 7/2002 | Kung et al. | 257/79 |
| 2001/0025989 A1* | 10/2001 | Shibuya et al. | 257/347 |
| 2002/0063256 A1* | 5/2002 | Lin | 257/79 |
| 2002/0063258 A1* | 5/2002 | Motoki | 257/95 |
| 2003/0006211 A1* | 1/2003 | Fukunaga et al. | 216/2 |
| 2005/0179130 A1* | 8/2005 | Tanaka et al. | 257/730 |
| 2006/0071230 A1* | 4/2006 | Lee et al. | 257/103 |

* cited by examiner

*Primary Examiner*—Mary Wilczewski
*Assistant Examiner*—Tsz K. Chiu
(74) *Attorney, Agent, or Firm*—Rosenberg, Klein & Lee

(57) ABSTRACT

A light-emitting gallium nitride-based III-V group compound semiconductor device with high light extraction efficiency that features on a substrate with concave and/or convex surface, a texturing surface layer, and a transparent conductive window layer. Therefore, the operating voltage is decreased and the efficiency of light extracting is improved.

9 Claims, 2 Drawing Sheets

LIGHT-EMITTING GALLIUM NITRIDE-BASED III-V GROUP COMPOUND SEMICONDUCTOR DEVICE WITH HIGH LIGHT EXTRACTION EFFICIENCY

BACKGROUND OF THE INVENTION

The present invention relates to a light-emitting gallium nitride-based III-V group compound semiconductor device with high light extraction efficiency, especially to a compound semiconductor device that reduces the operating voltage and improves the efficiency of light extracting.

Refer to FIG. 1, the structure of conventional light-emitting gallium nitride-based III-V group compound semiconductor device is disclosed. The device includes a sapphire substrate 10', a gallium nitride buffer layer 20', a n-type gallium nitride contact layer 30', an indium gallium nitride (InGaN) emitting layer 40', a p-type gallium nitride layer 50', a p-type gallium nitride contact layer 60' (from layer 20' to layer 60' are called epitaxy structure)', a transparent conductive layer 70' made of Ni/Au. Moreover, a p-type metal electrode 80' is stacked over the transparent conductive layer 70' and a n-type metal electrode 90' is arranged over the n-type gallium nitride contact layer 30'.

In order to increase the light extraction efficiency of the device, the optical transparency of the transparent conductive layer is increased or a reflective layer is added under the light-emitting layer. However, both methods can only increase the light extraction efficiency of the emitting light along vertical direction.

The refractive index of the epitaxy structure of gallium nitride is 2.4, the refractive index of the sapphire substrate is 1.77, and the refractive index of the packaging resin is 1.5. Due to the waveguide effect, part of the light emitting from the light-emitting layer is reflected by the sapphire substrate and the packaging resin and then is absorbed by the multi-layer epitaxy structure of gallium nitride. Thus the light extraction efficiency is decreased. In order to break the waveguide effect, a texturing surface or a rough surface is provided on the surface of the light-emitting compound semiconductor device so as to reduce reflection of light through various interfaces with different refractive indices.

During the growth of the epitaxy, the texturing or rough surface are formed artificially, please refer to the Taiwanese patent application No. 092132987, the process has been described therein. Moreover, in order to increase the light extraction efficiency and reduce the operating voltage, a structure is disclosed in the Taiwanese patent application No. 093204255 whose applicant is the same with the present invention. A conventional transparent conductive layer made of Ni/Au is replaced by a transparent conductive window layer whose optical transmittance is better than Ni/Au and having good ohmic contact with the texturing surface layer so as to reduce the operating voltage.

Furthermore, if the bottom of the multi-layer epitaxy structure of gallium nitride is also provided with a texturing surface or a rough surface, the light extraction efficiency of the device is further improved.

SUMMARY OF THE INVENTION

Therefore, it is a primary object of the present invention to provide a light-emitting gallium nitride-based III-V group compound semiconductor device with high light extraction efficiency having a substrate with concave and/or convex surfaces and a texturing surface layer, both for improving the efficiency of light extraction.

It is a further object of the present invention to provide a light-emitting gallium nitride-based III-V group compound semiconductor device having a substrate with concave and/or convex surfaces, a texturing surface layer and a transparent conductive layer. The texturing surface layer establishes an ohmic contact with the transparent conductive layer so as to reduce to operating voltage of the light-emitting device.

In order to achieve the objects mentioned above, the present invention is composed by a substrate with concave and/or convex surfaces, a texturing surface layer and a transparent conductive layer. The present invention has lower operating voltage and higher light extraction efficiency.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFFERED EMBODIMENT

The present invention can solve the problem of waveguide effect of conventional light-emitting device. The waveguide effect causes that part of the light emitting from the light-emitting layer is reflected by the sapphire substrate and the packaging resin and then is absorbed by the multi-layer epitaxy structure of gallium nitride. Thus the light extraction efficiency is decreased. The present invention provides a substrate with concave and/or convex surfaces, and a texturing surface formed on the surface of the light-emitting compound semiconductor device during the growth of epitaxy so as to break the waveguide effect and raise the light extraction efficiency.

Figure 1:
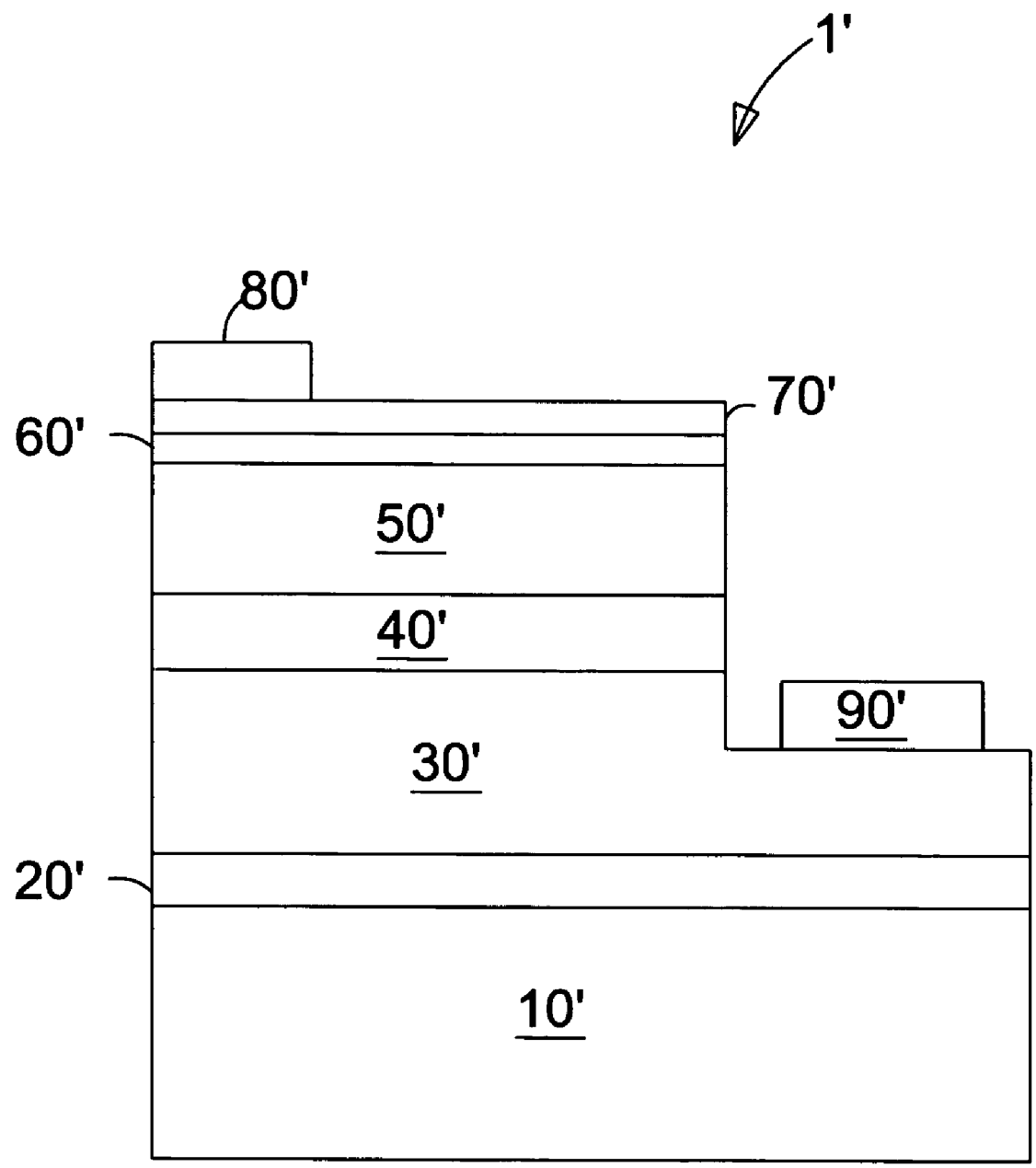
FIG. 1 is a schematic drawing showing the structure of a prior art of the light-emitting gallium nitride-based III-V group compound semiconductor device.
Figure 2:
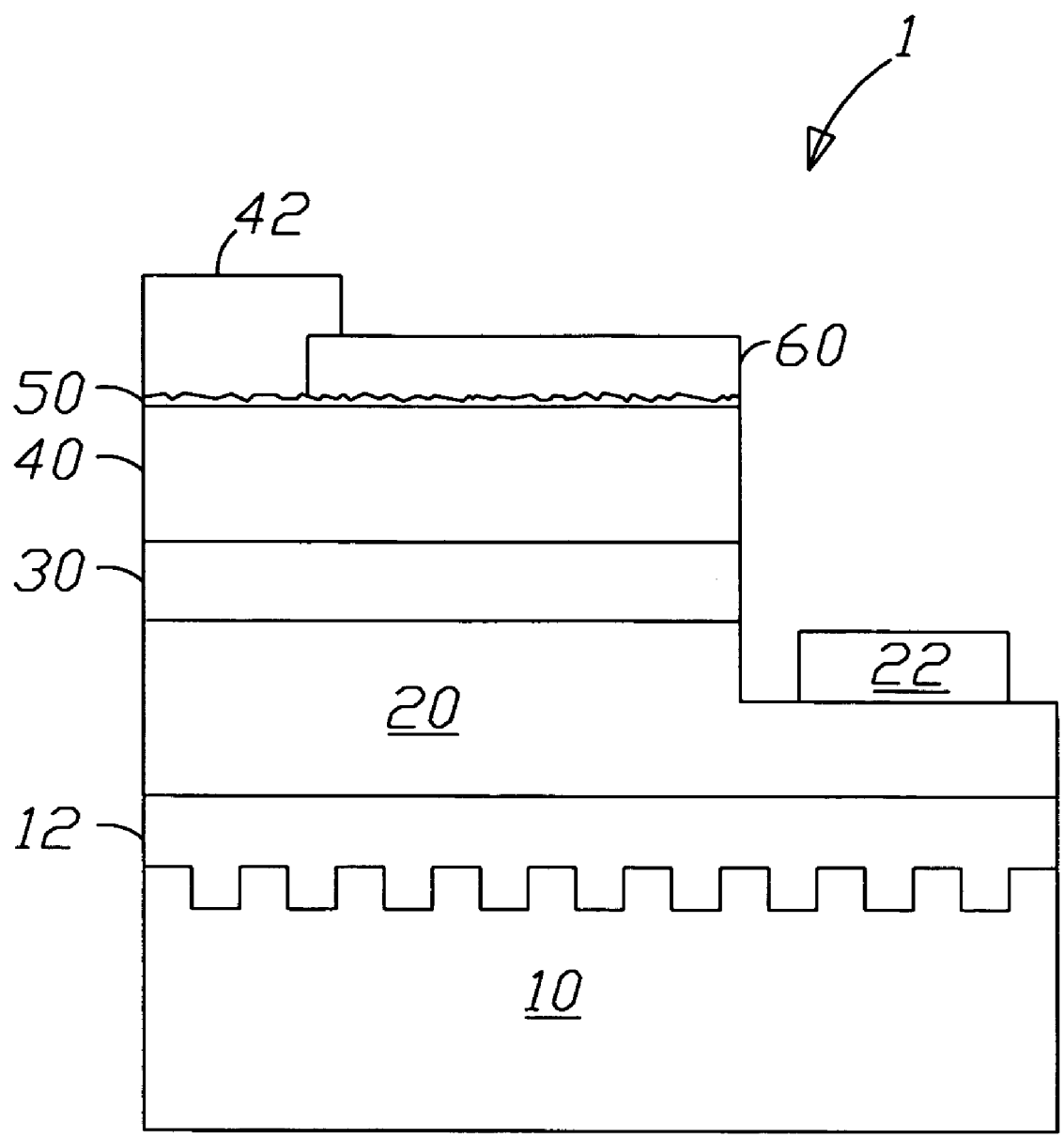
FIG. 2 is a schematic drawing showing the structure of an embodiment of the present invention.

Refer to FIG. 2, a better embodiment of the present invention is disclosed. A light-emitting gallium nitride-based III-V group compound semiconductor device includes a substrate layer 10 having concave and/or convex surfaces, an n-type gallium nitride-based III-V group compound semiconductor layer 20, a light-emitting layer (active layer) 30, a p-type gallium nitride-based III-V group compound semiconductor layer 40, a texturing surface layer 50, a transparent conductive window layer 60, a first electrode 22 and a second electrode 42, wherein the substrate 10 further having a buffer layer 12.

The substrate 10 can be a transparent substrate, such as sapphire, zinc oxide (ZnO), lithium gallium oxide, lithium aluminum oxide, or spinel. The n-type gallium nitride-based III-V group compound semiconductor layer 20 is made of n-doped gallium nitride (GaN), aluminum indium gallium nitride (AlInGaN), or indium gallium nitride (InGaN) layer. The p-type gallium nitride-based III-V group compound semiconductor layer 40 is a p-doped gallium nitride(GaN), aluminum indium gallium nitride (AlInGaN), or indium gallium nitride (InGaN) layer. The texturing surface layer 50 is a p-doped, n-doped, or co-doped gallium nitride-based III-V group compound semiconductor layer, whose chemical formula is AlInGaNPAs. The light-emitting layer (active layer) 30 is formed of a nitride compound semiconductors having indium.

The transparent conductive window layer 60 is a transparent and conductive oxide layer made of an indium oxide, tin oxide, indium molybdenum oxide(IMO), zinc oxide (ZnO), indium zinc oxide(IZO), indium cerium oxide(ICO), or indium tin oxide(ITO).

The texturing surface layer 50 is formed due to the control during the epitaxy growth, allowing formation of such structure on the surface of the p-type gallium nitride-based III-V group compound semiconductor layer 40. Thus the contact resistance between the texturing surface layer 50 and the transparent conductive window layer 60 is reduced. Accordingly, the operating voltage of the light-emitting device is decreased.

The concave and/or convex surface on the substrate is made by a photosensitive mask used in etch process. For example, the sapphire substrate is C-Plane (0001) and the photosensitive mask made of nickel, photo-resist, silicon oxide, or silicon nitride is parallel or perpendicular to the A-plane of the substrate. Then the sapphire substrate is etched by dry etch techniques such as reactive ion etching (RIE) or inductively coupled plasma etching (ICP), together with the gas combination of $BCl_3$, $Cl_2$ and Ar. Thus the sapphire substrate turns into a substrate with a plurality of convexity and concavity while the width of the convexity ranges from 1 um to 5 um, the width of the concavity ranges from 1 um to 5 um, and the etch depth is from 0.1 to 2 um.

Comparison chart
(the transparent conductive window layer is made of indium tin oxide)

| Structure of the light-emitting device | output power(mw) | Vf at 20 mA |
|---|---|---|
| with flat surface | 8.8 | 4.0 |
| with texturing surface | 12 | 3.2 |
| with a substrate having concave and/or convex surfaces and a layer of texturing surface | 13.7 | 3.2 |

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A light-emitting gallium nitride-based III-V group compound semiconductor device with high light extraction efficiency, comprising:

a substrate, a buffer layer formed on said substrate, said substrate and said buffer layer having a concave and/or convex contoured contact interface formed therebetween and continually and uninterruptibly extending across substantially the entire surface of said substrate and said buffer layer;

a semiconductor stacked structure arranged over said substrate, defining:

a first gallium nitride-based III-V group compound semiconductor layer, a second gallium nitride-based III-V group compound semiconductor layer arranged over said first gallium nitride-based III-V group compound semiconductor layer, and a light-emitting layer sandwiched between said first and second gallium nitride-based III-V group compound semiconductor layers;

a texturing surface layer of AlInGaNPAs formed during the epitaxial growth on said second gallium nitride-based III-V group compound semiconductor layer for reducing a contact resistance therewith and thereby reducing an operating voltage of said semiconductor device;

a transparent conductive window layer arranged on said texturing surface layer and establishing an ohmic contact with said texturing surface layer, said texturing surface layer being sandwiched between said second gallium nitride-based III-V group compound semiconductor layer and said transparent conductive window;

a first electrode provided in electrical contact with said first gallium nitride-based III-V group compound semiconductor layer of said semiconductor stacked structure; and a second electrode arranged directly on said texturing surface layer in lateral disposition with said transparent conductive window layer, said second electrode forming an electrical contact with said transparent conductive window layer and said texturing surface layer.

2. The device according to claim 1, wherein said substrate is a transparent substrate with the width of the convexity of 1 um to 5 um, the width of the concavity from 1 um to 5 um, and the etch depth from 0.1 to 2 um.

3. The device according to claim 1, wherein said substrate is a single crystal whose refractive index is smaller than that of said semiconductor stacked structure.

4. The device according to claim 1, wherein said first gallium nitride-based III-V group compound semiconductor layer is made of gallium nitride (GaN), aluminum indium gallium nitride (AlInGaN), or indium gallium nitride (InGaN).

5. The device according to claim 1, wherein said second gallium nitride-based III-V group compound semiconductor layer is made of gallium nitride (GaN), aluminum indium gallium nitride (AlInGaN), or indium gallium nitride (InGaN).

6. The device according to claim 1, wherein said light-emitting layer is formed of a nitride compound semiconductor having indium.

7. The device according to claim 1, wherein said transparent conductive window layer is made of indium oxide, tin oxide, indium molybdenum oxide, zinc oxide, indium zinc oxide, indium cerium oxide, or indium tin oxide.

8. The device according to claim 1, wherein said texturing surface layer and said transparent conductive window layer have the same conductivity.

9. The device according to claim 1, wherein said texturing surface layer and said transparent conductive window layer have different conductivities.

* * * * *